(12) United States Patent
Farkas et al.

(10) Patent No.: US 11,510,317 B1
(45) Date of Patent: Nov. 22, 2022

(54) SYSTEMS AND METHODS FOR MAXIMIZING SIGNAL INTEGRITY ON CIRCUIT BOARDS

(71) Applicant: Dell Products L.P., Round Rock, TX (US)

(72) Inventors: Sandor Farkas, Round Rock, TX (US); Bhyrav Mutnury, Austin, TX (US); Steven Ethridge, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 21 days.

(21) Appl. No.: 17/338,369

(22) Filed: Jun. 3, 2021

(51) Int. Cl.
| | |
|---|---|
| *H05K 3/00* | (2006.01) |
| *H05K 1/11* | (2006.01) |
| *H05K 1/02* | (2006.01) |
| *H05K 3/40* | (2006.01) |

(52) U.S. Cl.
CPC ........... *H05K 1/115* (2013.01); *H05K 1/0298* (2013.01); *H05K 3/0047* (2013.01); *H05K 3/4038* (2013.01); *H05K 2201/09545* (2013.01)

(58) Field of Classification Search
CPC .... H05K 1/115; H05K 3/0047; H05K 3/4038; H05K 2201/09545
USPC .......................................................... 174/266
See application file for complete search history.

(56) References Cited

U.S. PATENT DOCUMENTS

| | | | |
|---|---|---|---|
| 10,251,270 B2 * | 4/2019 | Xiong ..................... | H05K 1/115 |
| 2006/0278429 A1 * | 12/2006 | Tourne .................. | H05K 3/429 174/266 |
| 2015/0008029 A1 * | 1/2015 | Lee ........................ | H05K 3/429 174/266 |
| 2017/0231099 A1 * | 8/2017 | Mundt ................. | H05K 3/0047 |

* cited by examiner

*Primary Examiner* — Sherman Ng
(74) *Attorney, Agent, or Firm* — Jackson Walker L.L.P.

(57) ABSTRACT

A circuit board may include a plurality of electrically-conductive layers separated and supported by layers of insulating material laminated together and a via electrically coupled to a first layer of the circuit board and coupled to a second layer of the circuit board, the via comprising a first via portion comprising electrically-conductive material and having a first diameter and a first depth from a surface of the circuit board and a second via portion comprising electrically-conductive material and having a second diameter smaller than the first diameter and a second depth from the first depth.

20 Claims, 2 Drawing Sheets

SYSTEMS AND METHODS FOR MAXIMIZING SIGNAL INTEGRITY ON CIRCUIT BOARDS

TECHNICAL FIELD

The present disclosure relates in general to information handling systems, and more particularly to systems and methods for maximizing signal integrity on circuit boards.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include one or more circuit boards operable to mechanically support and electrically couple electronic components making up the information handling system. For example, circuit boards may be used as part of motherboards, memories, storage devices, storage device controllers, peripherals, peripheral cards, network interface cards, and/or other electronic components. As is known in the art, a circuit board may comprise a plurality of conductive layers separated and supported by layers of insulating material (e.g., dielectric material) laminated together, with conductive traces disposed on and/or in any of such conductive layers.

A circuit board may have numerous electrically-conductive conduits, including traces, vias, pads, and/or other electrically-conductive conduits. A via may comprise a substantially electrically conductive material and may be formed such that vias may electrically couple together traces on different layers of a circuit board, thus allowing signals to propagate between layers of the circuit board.

Increasing processor performance has increasingly required circuit board designs with greater number of layers and thicker dielectric layers, leading to increasing thicknesses of circuit boards. Such increased thicknesses can lead to problems and disadvantages.

For example, thicker circuit boards may result in longer via stubs, requiring back-drilling to multiple depths in order to reduce stub size. Also, thicker circuit boards may require larger drill sizes for creating vias, in order to satisfy aspect ratio limitations (e.g., 10:1 depth to thickness ratio) designed to prevent damage to drill bits. Such increased via circumferences may in turn lead to larger antipads present in ground plane and power plane layers of the circuit board, wherein such antipads electrically insulate vias passing through such ground planes and power planes from the planes themselves.

Such increased via and antipad sizes may negatively affect layout density of components and signal routing of the circuit board. Further, such increased via sizes may increase barrel capacitance and capacitive coupling between adjacent vias, potentially negatively affecting signal integrity.

SUMMARY

In accordance with the teachings of the present disclosure, the disadvantages and problems associated with existing circuit board techniques may be reduced or eliminated.

In accordance with embodiments of the present disclosure, a circuit board may include a plurality of electrically-conductive layers separated and supported by layers of insulating material laminated together and a via electrically coupled to a first layer of the circuit board and coupled to a second layer of the circuit board, the via comprising a first via portion comprising electrically-conductive material and having a first diameter and a first depth from a surface of the circuit board and a second via portion comprising electrically-conductive material and having a second diameter smaller than the first diameter and a second depth from the first depth.

In accordance with these and other embodiments of the present disclosure, an information handling system may include an enclosure and a circuit board housed in the enclosure, the circuit board comprising a plurality of electrically-conductive layers separated and supported by layers of insulating material laminated together and a via electrically coupled to a first layer of the circuit board and coupled to a second layer of the circuit board, the via comprising a first via portion comprising electrically-conductive material and having a first diameter and a first depth from a surface of the circuit board and a second via portion comprising electrically-conductive material and having a second diameter smaller than the first diameter and a second depth from the first depth.

In accordance with these and other embodiments of the present disclosure, a method for forming a circuit board may include forming a plurality of conductive layers separated and supported by layers of insulating material laminated together and forming a via electrically coupled to a first layer of the circuit board and coupled to a second layer of the circuit board, the via comprising a first via portion comprising electrically-conductive material and having a first diameter and a first depth from a surface of the circuit board and a second via portion comprising electrically-conductive material and having a second diameter smaller than the first diameter and a second depth from the first depth.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
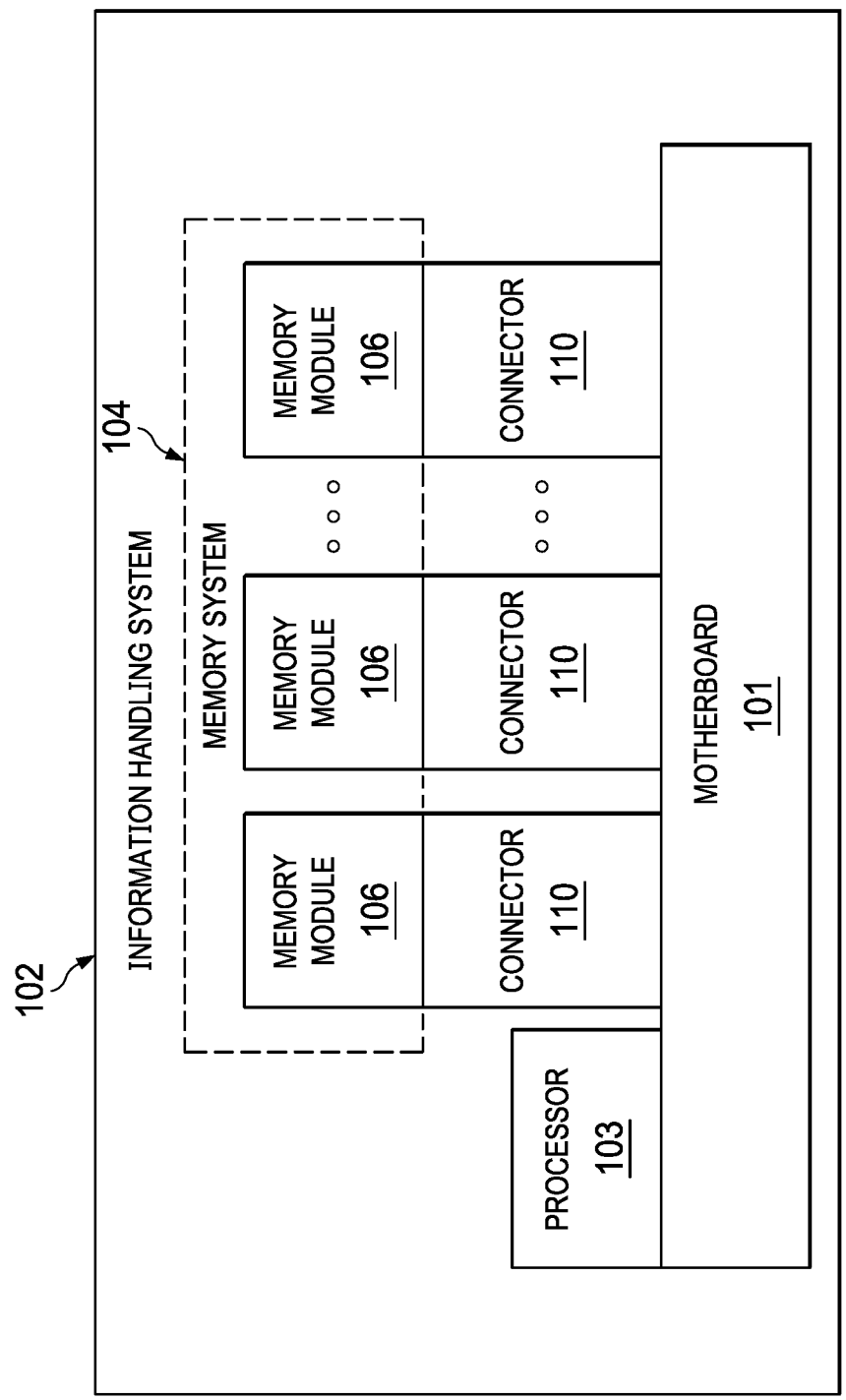
FIG. 1 illustrates a block diagram of an example information handling system, in accordance with embodiments of the present disclosure.
Figure 2:
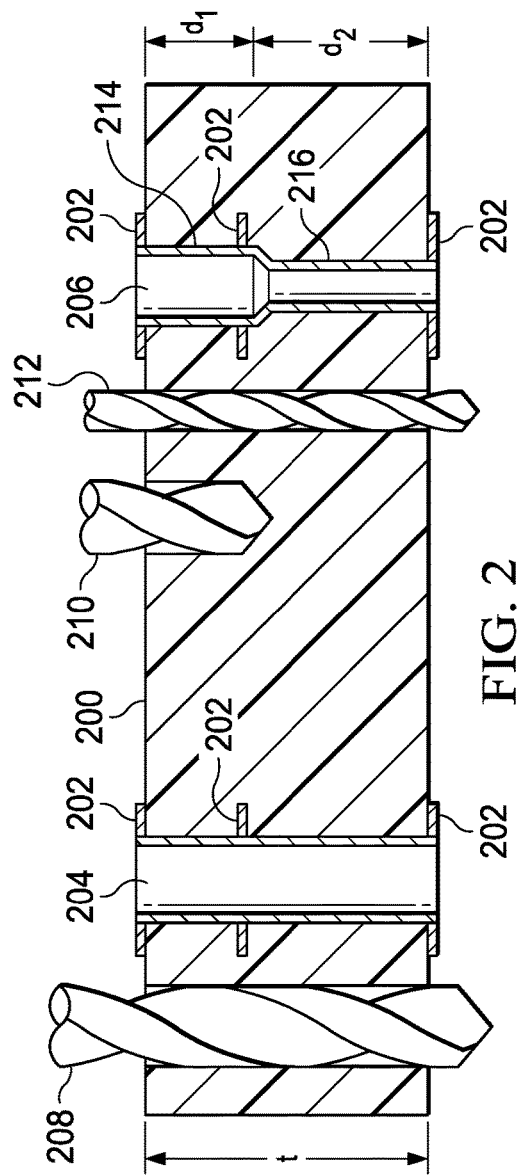
FIG. 2 illustrates a cross-section side elevation perspective view of an example circuit board, in accordance with embodiments of the present disclosure.
Figure 3:
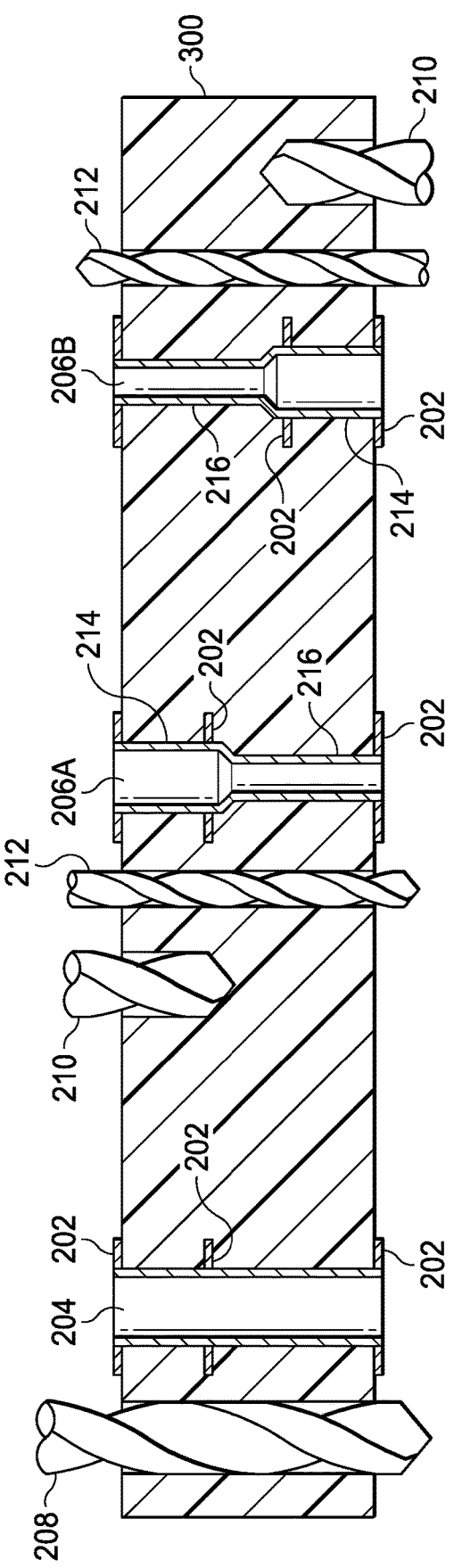
FIG. 3 illustrates a cross-section side elevation perspective view of another example circuit board, in accordance with embodiments of the present disclosure.

Preferred embodiments and their advantages are best understood by reference to FIGS. 1 through 3, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

As discussed above, an information handling system may include one or more circuit boards operable to mechanically support and electrically connect electronic components making up the information handling system (e.g., packaged integrated circuits). Circuit boards may be used as part of motherboards, memories, storage devices, storage device controllers, peripherals, peripheral cards, network interface cards, and/or other electronic components. As used herein, the term "circuit board" includes printed circuit boards (PCBs), printed wiring boards (PWBs), etched wiring boards, and/or any other board or similar physical structure operable to mechanically support and electrically couple electronic components.

FIG. 1 illustrates a block diagram of an example information handling system 102, in accordance with embodiments of the present disclosure. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a motherboard 101, a processor 103 coupled to motherboard 101, a plurality of connectors 110 mechanically and electrically coupled to motherboard 101, and memory system 104 comprising a plurality of memory modules 106 each electrically coupled to motherboard 101 via a respective connector 110. Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may be implemented by a plurality of memory modules 106 removably coupled to connectors 110. Each memory module 106 may include any system, device or apparatus configured to retain program instructions and/or data for a period of time (e.g., computer-readable media). A memory module 106 may comprise a dual in-line package (DIP) memory, a dual-inline memory module (DIMM), a Single In-line Pin Package (SIPP) memory, a Single Inline Memory Module (SIMM), a Ball Grid Array (BGA), or any other suitable memory module. In some embodiments, a memory module 106 may include a mating edge connector configured to mechanically and electrically couple to a corresponding receptacle slot or other opening of a connector 110. In some embodiments, a memory module 106 may be implemented using a circuit board.

A connector 110 may comprise any system, device, or apparatus fixedly mounted on motherboard 101 and may be constructed to mechanically couple a corresponding memory module 106 to motherboard 101 and to electrically couple such memory module 106 to motherboard 101, processor 103, and/or other components of information handling system 102. Connector 110 may comprise a socket including a receptacle slot or other opening configured to removably receive a corresponding mating edge connector of a memory module 106.

In addition to motherboard 101, processor 103, connectors 110, and memory modules 106, information handling system 102 may include one or more other information handling resources.

FIG. 2 illustrates a cross-section side elevation perspective view of an example circuit board 200, in accordance with embodiments of the present disclosure. Circuit board 200 or a circuit board similar to circuit board 200 may be used to implement at least a portion of motherboard 101, a memory module 106, and/or other information handling resources of information handling system 102. As depicted in FIG. 2, circuit board 200 may include a plurality of pads 202, traces (not explicitly shown, and vias, including a traditional via 204 and a double-drilled via 206. Pads 202 may comprise a conductive material and may be formed on a surface (e.g., top or bottom surface) of circuit board 200 or within an internal layer of circuit board 200. Further, each pad 202 may be operable to receive a pin of an electronic component (e.g., a packaged integrated circuit) and provide electrical connectivity between the pin and one or more traces. Traces may comprise a conductive material and may be formed on a surface of circuit board 200, or in a layer of circuit board 200 not visible from the surface thereof. Further, each trace may be operable to provide conductive pathways between electronic components mounted to pads 202.

Connectivity between pads 202 and/or traces disposed on and/or in various layers of circuit board 200 may be provided by traditional vias 204 or double-drilled vias 206.

A traditional via 204 may have a uniform diameter throughout (e.g., the same diameter from a top surface of circuit board 200 to the bottom surface of circuit board 200), and may be formed by drilling a hole through circuit board 200 using a drill 208 having a diameter suitable for drilling such hole, and then plating the interior surfaces exposed by the hole with electrically-conductive material (e.g., metal), such that traditional via 204 resembles a cylindrical tube with a consistent diameter throughout.

On the other hand, a double-drilled via 206 may be formed by first drilling a first hole from a surface of circuit board 200 of a first diameter to a first depth $d_1$ with a drill 210 having approximately the first diameter, then drilling a second hole of a second diameter smaller than the first diameter from a bottom of the first hole to a second depth $d_2$ (wherein the sum of first depth $d_1$ and second depth $d_2$ may equal a thickness t of circuit board 200). After drilling, the interior surfaces exposed by the two holes may be plated with electrically-conductive material (e.g., metal), such that double-drilled via 206 resembles a cylindrical tube of the first diameter in series with a cylindrical tube of the second diameter. Thus, double-drilled via 206 may include a first via portion 214 having the first diameter and first depth $d_1$ coupled to a second portion 216 having the second diameter and second depth $d_2$, forming one continuous tube having at least two different diameters throughout. In some embodiments, the first diameter and the second diameter may be approximately concentric.

In some embodiments, both the first diameter and the second diameter of double-drilled via 206 may be smaller than the diameter of traditional via 204.

FIG. 3 illustrates a cross-section side elevation perspective view of an example circuit board 300, in accordance with embodiments of the present disclosure. Circuit board 300 or a circuit board similar to circuit board 300 may be used to implement at least a portion of motherboard 101, a memory module 106, and/or other information handling resources of information handling system 102. Circuit board 300 may be similar in many respects to circuit board 300, except that in addition to traditional via 204 and a double-drilled via 206A formed from drilling on the top surface of circuit board 300, circuit board 300 may also include a double-drilled via 206B formed from drilling on the bottom surface of circuit board 300.

Although the foregoing discussion contemplates circuit board 200 and circuit board 300 each having a traditional via 204, the presence of traditional via 204 in FIGS. 2 and 3 is mainly for purposes of clarity and exposition of the present disclosure, and thus, circuit board 200 and/or circuit board 300 may include no traditional vias 204 in some embodiments.

Further, although FIG. 2 depicts circuit board 200 having a single double-drilled via 206, in some embodiments, circuit board 200 may have a plurality of double-drilled vias 206. Similarly, although FIG. 3 depicts circuit board 300 having two double-drilled vias 206, in some embodiments, circuit board 300 may have any suitable number of double-drilled vias 206.

In addition, in some embodiments, multi-drilled vias may be formed in a circuit board in which three or more drilling steps are used to create such multi-drilled vias. For example, a triple-drilled via may be formed by first drilling a first hole from a surface of circuit board 200 of a first diameter to a first depth, then drilling a second hole of a second diameter smaller than the first diameter from a bottom of the first hole to a second depth, and then drilling a third hole of a third diameter smaller than the second diameter from a bottom of the second hole to a third depth (wherein the sum of the first depth, second depth, and third depth may be equal to a thickness of the circuit board). After drilling, the interior surfaces exposed by the three holes may be plated with electrically-conductive material (e.g., metal), such that the resulting via resembles a cylindrical tube of the first diameter in series with a cylindrical tube of the second diameter, further in series with a cylindrical tube of the third diameter. Using similar approaches, a multi-drilled via may be formed using more than three drilling steps.

The systems and methods described above may provide circuit board designers with an ability to use smaller drill sizes and smaller via pad sizes, which may optimize electrical performance of the vias.

The systems and methods described above may also be combined with back drilling used to reduce or eliminate via stubs. An additional benefit of the methods and systems described herein is that the back drill size may be minimized because the via barrel size of a double-drilled via 206 may be smaller than that of a traditional via 204. Such smaller-sized back drilling may leave more useful routing space in routing layers and more conductive material present in power plane and ground plane layers.

The systems and methods described herein may reduce or eliminate the signal integrity problems described in the Background section, and may offer higher design density, lower capacitance, and lower capacitive coupling as compared to traditional approaches and crosstalk.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A circuit board, comprising:
a plurality of electrically-conductive layers separated and supported by layers of insulating material laminated together;
a first via having a uniform diameter throughout; and
a second via electrically coupled to a first layer of the circuit board and coupled to a second layer of the circuit board, the second via comprising:
a first via portion comprising electrically-conductive material and having a first diameter and a first depth from a surface of the circuit board; and
a second via portion comprising electrically-conductive material and having a second diameter smaller than the first diameter and a second depth from the first depth; wherein both the first diameter and the second diameter of the second via are smaller than the uniform diameter of the first via.

2. The circuit board of claim 1, wherein:
the first via portion comprises a first cylindrical tube of the first diameter; and
the second via portion comprises a second cylindrical tube of the second diameter in series with the first via portion.

3. The circuit board of claim 2, wherein together the first cylindrical tube and the second cylindrical tube form one continuous tube of differing diameters.

4. The circuit board of claim 1, wherein the first diameter and the second diameter are approximately concentric.

5. The circuit board of claim 1, wherein the second via comprises a layer of electrically-conductive material formed on interior walls of an opening through the circuit board.

6. The circuit board of claim 1, wherein a sum of the first depth and the second depth equals a thickness of the circuit board.

7. An information handling system comprising:
an enclosure; and
a circuit board housed in the enclosure, the circuit board comprising:
a plurality of electrically-conductive layers separated and supported by layers of insulating material laminated together;
a first via having a uniform diameter throughout; and
a second via electrically coupled to a first layer of the circuit board and coupled to a second layer of the circuit board, the second via comprising:
a first via portion comprising electrically-conductive material and having a first diameter and a first depth from a surface of the circuit board; and
a second via portion comprising electrically-conductive material and having a second diameter smaller than the first diameter and a second depth from the first depth; wherein both the first diameter and the second diameter of the second via are smaller than the uniform diameter of the first via.

8. The information handling system of claim 7, wherein:
the first via portion comprises a first cylindrical tube of the first diameter; and
the second via portion comprises a second cylindrical tube of the second diameter in series with the first via portion.

9. The information handling system of claim 8, wherein together the first cylindrical tube and the second cylindrical tube form one continuous tube of differing diameters.

10. The information handling system of claim 7, wherein the first diameter and the second diameter are approximately concentric.

11. The information handling system of claim 7, wherein the second via comprises a layer of electrically-conductive material formed on interior walls of an opening through the circuit board.

12. The information handling system of claim 7, wherein a sum of the first depth and the second depth equals a thickness of the circuit board.

13. A method for forming a circuit board, comprising:
forming a plurality of conductive layers separated and supported by layers of insulating material laminated together;
forming a first via between layers of the circuit board; the first via having a uniform diameter throughout; and
forming a second via electrically coupled to a first layer of the circuit board and coupled to a second layer of the circuit board, the second via comprising:
a first via portion comprising electrically-conductive material and having a first diameter and a first depth from a surface of the circuit board; and
a second via portion comprising electrically-conductive material and having a second diameter smaller than the first diameter and a second depth from the first depth;
wherein both the first diameter and the second diameter of the second via are smaller than a diameter of the first via.

14. The method of claim 13, wherein:
the first via portion comprises a first cylindrical tube of the first diameter; and
the second via portion comprises a second cylindrical tube of the second diameter in series with the first via portion.

15. The method of claim 14, wherein together the first cylindrical tube and the second cylindrical tube form one continuous tube of differing diameters.

16. The method of claim 13, wherein the first diameter and the second diameter are approximately concentric.

17. The method of claim 13, wherein the second via comprises a layer of electrically-conductive material formed on interior walls of an opening through the circuit board.

18. The method of claim 13, wherein a sum of the first depth and the second depth equals a thickness of the circuit board.

19. The method of claim 13, wherein forming the second via comprises:
forming a first hole with the first diameter from the surface of the circuit board to the first depth;
forming a second hole with the second diameter from the first depth; and
plating interior surfaces exposed by the hole with electrically-conductive material.

20. The method of claim 13, wherein:
forming the first hole comprises drilling the first hole with a first drill bit having approximately the first diameter; and
forming the second hole comprises drilling the second hole with a second drill bit having approximately the second diameter.

* * * * *